United States Patent [19]

Doyle

[11] 4,273,801

[45] Jun. 16, 1981

[54] PASSIVE BUBBLE GENERATOR

[75] Inventor: William D. Doyle, Dresher, Pa.

[73] Assignee: Sperry Corporation, New York, N.Y.

[21] Appl. No.: 62,842

[22] Filed: Aug. 1, 1979

[51] Int. Cl.³ .............................................. B05D 3/14
[52] U.S. Cl. ..................................... 427/48; 427/127; 427/132
[58] Field of Search ......................... 427/48, 127, 132; 428/900

[56] References Cited

U.S. PATENT DOCUMENTS 3,530,446  9/1970  Perneski .............................. 340/174

OTHER PUBLICATIONS

IBM Tech. Dis. Bull., Feb. 1972, 2559-2560, vol. 14, No. 9, Chang.

Primary Examiner—Bernard D. Pianalto
Attorney, Agent, or Firm—Robert E. Lee, Jr.; William E. Cleaver; Marshall M. Truex

[57] ABSTRACT

The present invention is a method and apparatus for passive generation of magnetic bubbles in thin layers of magnetic materials, such as garnets, and uses specially designed permalloy elements which with the rotation of an in-plane magnetic field act to generate magnetic bubbles over a wide range of bias magnetic field values. The design of a special permalloy element includes an angular portion and a contiguous remaining portion having a large surface area relative to the angular portion. Pulsing of the in-plane rotating field to higher field values as it passes through a predetermined orientation with respect to the angular portion generates magnetic bubbles in a controllable manner for fixed values of the bias field.

5 Claims, 1 Drawing Figure

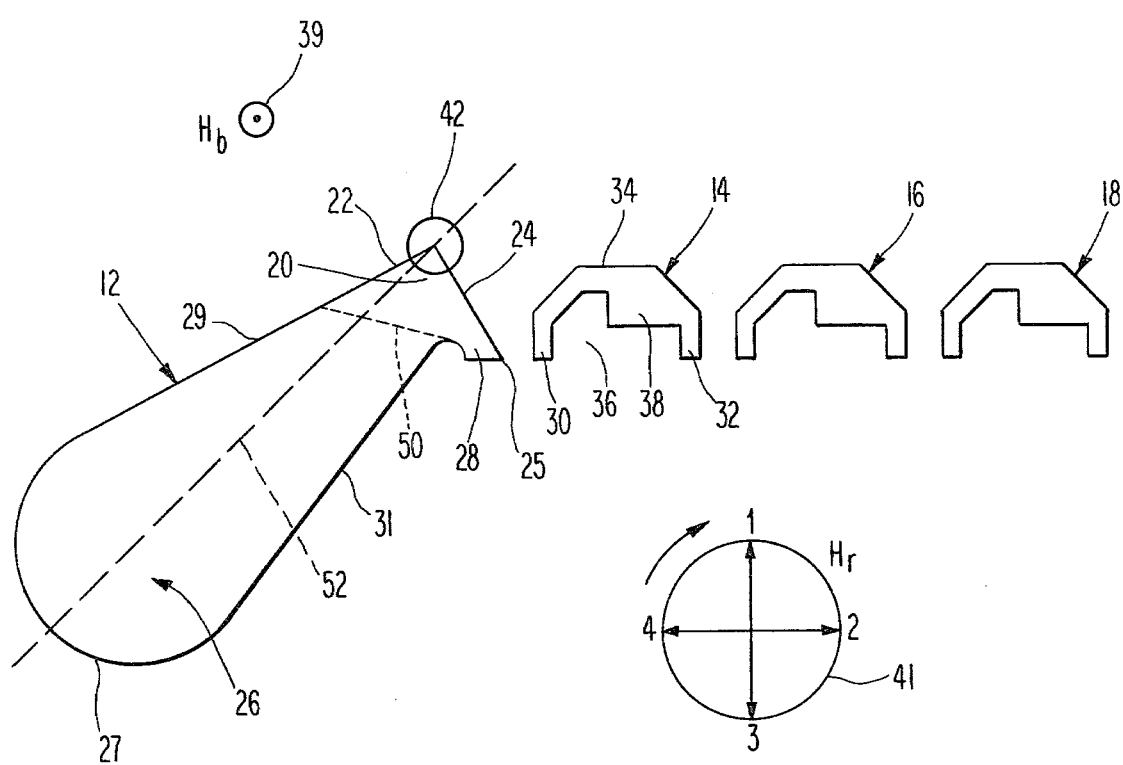

PASSIVE BUBBLE GENERATOR

BACKGROUND

This invention relates to passive generation of magnetic bubbles in magnetic bubble devices.

Magnetic bubbles are mobile, single wall, cylindrical domains of magnetization found in specially formed thin planar slabs of magnetic materials when these materials are subjected to a bias field perpendicular to the plane of the material. The bubbles or cylindrical single wall domains are magnetized in a direction opposite to the bias field magnetization of the material and parallel to the direction of the bias field. Magnetic bubble devices are used as computer memories, the presence or absence of a bubble at a particular location within the material representing a one or a zero. This memory technology promises to provide high density memories (greater than $10^6$ bits per $in^2$) with fast access times.

In the demagnetized state, i.e, in the absence of a bias field, the thin layer of magnetic material possesses a plurality of strip wall domains, i.e. a plurality of meandering quasi-parallel regions of uniform magnetization. Each domain is inherently magnetized in a direction normal to the plane of the material with approximately one half of the domains being magnetized oppositely to the other half. As the bias field strength is increased a strip-bubble transition field value or strip-out field value is reached where strip single wall domains contract into cylindrical single wall or bubble domains, i.e., the strip single wall domains close on themselves and form cylinders of reverse magnetization in the material having roughly circular cross sections. As the bias field strength is increased further the diameters of the bubble domains decrease until a saturation field value is reached at which value all bubble domains collapse and the layer of material becomes saturated into one domain of magnetization.

In the prior art, once bubbles are generated they can be maintained in a stable condition by application of the bias field at operating strengths between the strip-out and saturation field values. At these operating bias levels, magnetic bubbles are moved about within the material by application of an in-plane rotating magnetic field. Patterns of permalloy elements laid down on the surface of the material provide paths along which the magnetic bubbles move in response to the rotating field.

Proper use of the bubble memory devices depends in part on the ability to completely control the generation of the bubbles within the material. Methods have been developed for controlled generation of bubbles at operating bias field values. In a book entitled, "Magnetic Bubbles" by A. H. Bobeck and E. Della Torre, a bubble generator is described at pages 177–184 which uses a special full-disk permalloy element in combination with a series of bar and T bar elements. As an example, a seed bubble permanently trapped and associated with the full disk element rotates with the positive polarity portion of the magnetization induced in the element by the rotating in-plane field. At some point during rotation of the in-plane field adjacent positive polarities occur in a portion of the full disk element and in a tip of an adjacent but spaced apart bar element from the T bar propagating channel. The positive polarities are close enough to stretch the seed bubble from the full disk element across to the adjacent bar element. Further rotation of the field causes a negative polarity to rotate between the rotating positive polarity on the full disk element and the positive polarity in the T bar propagating channel until the stretched bubble breaks leaving a seed bubble with the full disk element and a newly formed bubble in the T bar channel. With this method, a seed bubble must be maintained and associated with the full disk element at all times contributing to the unreliability of the device in the event that the seed bubble is destroyed or otherwise lost. Further, a new bubble is generated with every rotation of the in-plane field whether one is required or not.

Another means of generating bubbles requires the use of current carrying conductor loops such as those described in the above mentioned reference by Bobeck and Della Torre. When current is pulsed through the loop, the net bias field of the material is lowered locally, (directly beneath the current loop), thereby forming a bubble in the material. However, fabrication of separate layers of current carrying conductors on the surface of the bubble material and associated control circuitry increases manufacturing and design complexity driving up the cost and unreliability of bubble memory devices.

SUMMARY OF THE INVENTION

Applicant's invention comprises a method and apparatus for controlling bubble nucleation at operating bias field strengths which exceed the nucleation and strip-out field strengths of the material. The method involves using specially designed permalloy nucleating elements in combination with the pulsing of the in-plane rotating field to propagate bubbles within the material. The permalloy element comprises an angular portion formed by two intersecting straight edges of the element and a contiguous remaining portion connected to the angular portion and in the preferred embodiment is formed by a curved edge connected to the angular portion straight edges. Controlled, individual nucleation of bubbles at operating bias field values above the nucleation and strip-out field values occurs when the in-plane rotating field used for propagating bubbles within the material is pulsed to a higher field strength at a predetermined orientation with respect to the special permalloy element. If generation of a bubble is not desired then the rotating field is not pulsed.

The operating bias field value needed for nucleation is dependent upon the size of the angle formed by the intersecting edges and the area of the remaining portion as well as the strength of the rotating field. For a fixed value of the rotating field, the bias field value needed for nucleation is smaller for larger angles and smaller areas.

Applicant's invention provides an apparatus and method for controlled generation of magnetic bubbles over a wide range of operating bias field values without the need for a full disk seed bubble generator or separate current carrying conductor elements. Since no active flow of current is required through conductors attached to the device, this nucleation technique is referred to as passive.

BRIEF DESCRIPTION OF THE DRAWINGS

Objects, features and advantages of the present invention will become more fully apparent from the following detailed description of the preferred embodiment, the appended claims and the accompanying drawing in which the FIGURE is a pattern of permalloy elements showing a special field nucleating element for passive nucleation on single wall domains.

DETAILED DESCRIPTION OF THE DRAWINGS

While experimenting with an iron garnet magnetic bubble device comprised of $(YSmLuCa)_3(FeGe)_5O_{12}$, Applicant observed that bubble nucleation ooccured at bias field values in excess of nucleation and strip out field values. For example, bubbles began to form at the corners or angular portions of large permalloy features present as part of the bubble device at a bias field value of 133 oersted in the presence of a in-plane rotating magnetic field of 40 oersted. The normal saturation field value for this garnet material occurs at approximately 107 oersted and it was therefore surprising that nucleation could be made to occur at such a high bias field value. Applicant further experimentally observed that the strength of the bias field needed for nucleation in the bubble device was dependent upon the strength of the in-plane rotating field as was also dependent on the size and shape of various permalloy elements. For example, the bias field strength needed for nucleation was lower for permalloy features with larger angle corners and for smaller permalloy areas.

Although the exact mechanics of nucleation in Applicant's invention is not fully understood it is believed that the large area of a nucleating permalloy element in effect experiences an increased flux density that increases the magnetization of the element in a magnetic field, and the smaller angular portion of the nucleating element acts to intensify or concentrate one pole of the magnetization such as the positive polarity at the corner or intersection point of the angular portion of the nucleating permalloy element. The magnetic field created by the concentrated pole of magnetization opposes the bias field locally in the material below the angular portion lowering it to a point near which bubbles can begin to form or nucleate even in the presence of a bias field which otherwise exceeds the nucleation or strip-out field value. When the rotating field strength is increased or pulsed at an orientation which heightens the polarity of the angular region, such as the positive polarity, a bubble forms. For larger permalloy elements with narrower angular regions nucleation can be made to occur for higher bias field values since the concentratin of the flux increases with the narrower region and accordingly reduces the strength of the bias field.

Referring now to the FIGURE, a pattern of permalloy elements 12, 14, 16 and 18 which are necessary for nucleating a magnetic bubble and propagating it away from the nucleation point without the use of current carrying conductor elements. Current carrying conductors ordinarily are required to either stretch and split a seed bubble or nucleate a new bubble. In the preferred method of applicant's invention, special nucleation permalloy element 12 in combination with pulsing of a rotating in-plane magnetic field $H_r$ at the appropriate time during the rotation cycle 41 will produce nucleation of a magnetic bubble beneath a portion of the nucleating element for a fixed value of the bias field $H_b$ which is above the nucleation and strip-out field values.

Element 12 is a preferred embodiment field nucleating element comprising an angular portion 20 formed by straight edges 22 and 24. Element 12 also includes a contiguous remaining portion 26 connected to and extending away from region 20 and having a large area defined by curved edge 27 and interconnecting edges 29 and 31. The interface between the angular portion 20 and the remaining portion 26 can be defined by drawing an imaginary line represented by dotted line 50 from the end 25 of edge 24 to a point on edge 22 separated from the intersection of edges 22 and 24 by a distance equal to the length of edge 24. This leaves the area of the reamining portion 26 equal to or larger in area than the portion 20, preferable eight to ten times as large. It will be appreciated that the nucleating element of applicant's invention does not have to take on the exact shape of element 12 as shown in FIG. 1 nor does the imaginary line 50 necessarily represent exact interface between regions 20 and 26. However, the area of region 20 of special permalloy element 12 will be substantially equal to that of the area of one of the permalloy elements in the propagation pattern adjacent the element such as half-disc element 12, and the approximate center of region 26 will lie on a line such as dashed line 52 with the intersection of edges 22 and 24 defining region 20.

The special element 12 also comprises an end portion 28 which is adjacent to a normally shaped half disk element 14 well known to those skilled in the art and having end portions 30 and 32 and central connecting portion 34. Together the portions 30 through 34 of half disk element 14 partially enclose an open region 36. An asymetric portion 38 partially fills in region 36 and is connected to end portion 32 and center connecting portion 34.

In the FIGURE, fixed external magnetic bias field $H_b$ is present in a direction extending out of the plane of the paper and normal thereto. The direction of $H_b$ is indicated in the FIGURE by circle and dot 39. Also present is an in-plane rotating field $H_r$ which is generally weaker in field strength than the external bias field $H_b$ but which, in the preferred embodiment of applicant's invention, is capable of being pulsed at any time during the rotation cycle. The circle 41 depicting the direction of $H_r$ with lines and arrows 1-4 indicate the 90° positions of $H_r$ as it rotates in a clockwise direction. It will be understood that the clockwise rotation is a matter of convenience. The pattern of permalloy elements could be such that the method of this invention could be carried out with a counterclockwise rotation of $H_r$.

The field strength of $H_b$ is chosen to be in a magnetic bubble device operating range between the strip-out field value and the saturation field value where bubbles exist with stability and are readily moved and operated on by the in-plane rotating field and which are guided by a pattern of permalloy elements. For the material described above, $H_b$ might be at 90 oersted while $H_r$ at 30 oersted. New bubbles are not generated or nucleated ordinarily at these $H_b$ field values without the use of seed bubble generators or current carrying conductor loops described previously.

In the preferred embodiment of applicant's invention, when $H_r$ lies along permalloy element 12 through regions 26 and 20 substantially along line 52 at an orientation between positions number one and two of circle 41 of the FIGURE, the special nucleating permalloy element 12 will be magnetized with one pole or polarity of magnetization being concentrated in the angular region 20. As previously described it is believed that the large area 26 of the permalloy element acts to increase the magnetization field strength in the region 20. With the proper polarity of $H_r$, this orientation will have the effect of lowering the net field strength in the material, under the angular region 20, in the direction of the bias field making the nucleation of a bubble more likely. When it is desired to form a new bubble, $H_r$ is pulsed to a higher field value at the above described orientation thereby increasing the magnetization even further in the angular region 20 and lowering the field value in the direction of the bias field (locally in the material) to the nucleation field value where bubble 42 forms.

Further rotation of $H_r$ to position number two at a normal field value of 30 orested will move the newly formed bubble 42 from portion 20 to end portion 28 and then to end portions 28 and 30 together as $H_r$ continues to rotate to position number three in circle 41. At position number four, end portion 28 becomes negative in polarity and end portion 30 remains positive and bubble 42 separates from the element 12. Continued rotation of $H_r$ will propagate bubble 42 away on a path defined by the elements 14, 16 and 18. Periodic nucleation of bubbles is accomplished by perodically pulsing $H_r$ once every cycle as the orientation of $H_r$ moves between positions number one and two.

If, for some reason, it is desired to operate at field values of the bias field $H_b$ lower than 90 oersted, for example, nucleation can be made to occur with an increased angle formed by edges 22 and 24 (although the angle need not be changed) of the permalloy element 12 or by reducing the area of region 26. Making the angle of angular region 20 smaller and increasing the area of region 26 will permit the value of $H_b$ to be increased while still enabling nucleation to be effected.

It should be understood that the specific field values of 90 oersted for $H_b$ and 30 oersted for $H_r$ are only given by way of example as normal operating bias and in plane magnetic fields used with bubble devices of the type described herein. The actual values of $H_b$ and $H_r$ chosen for use with Applicant's invention will depend on the type of garnet material being used and the design of the special nucleating permalloy element. It should be cautioned that garnet materials should be chosen for their known ease of nucleation and reasonable range of bias and in-plane field values.

While the present invention has been disclosed in connection with the preferred embodiment thereof, it should be understood that there may be other embodiments which fall within the spirit and scope of the invention as defined by the following claims.

I claim:

1. In a method for controllably generating magnetic bubbles in a planar layer of material in which said bubbles exist in stable form when said layer is in the presence of a bias field of a predetermined value and oriented substantially perpendicular to said layer, and on which is present a pattern of permalloy elements defining a path along which said bubbles can move in response to a rotating magnetic field, which magnetic field rotates in the plane of said layer of material, the improvement comprising the steps of:

(a) providing a nucleating permalloy element with a nucleating angle portion and a contiguous area portion larger than the area of said angle portion; and (b) passively nucleating material bubbles by pulsing said in-plane rotating magnetic field when said field is at a predetermined orientation with respect to said nucleating angle portion.

2. The invention of claim 1 wherein said predetermined orientation is a direction along said nucleating element thru said contiguous area portion and said angular portion.

3. The invention of claim 2 wherein said rotating field is pulsed once every cycle of the rotating field.

4. A method of passively nucleating magnetic bubbles in a layer of material in which said bubbles can be moved in response to a rotating in-plane field and for which nucleation of magnetic bubbles occur naturally in the presence of a bias magnetic field weaker than a predetermined strip-out field value of said bias field and for which annihilation of magnetic bubbles occur naturally in the presence of a bias magnetic field stronger than a predetermined saturation field value of said bias field which exceeds the strip-out value comprising:

a. selecting field value for said bias field which is between said strip-out and said saturation field value and applying said selected bias field to said layer of material;

b. selecting a field value of said rotating field at which nucleation in said layer can be effected in view of said selected value of said bias field and applying said selecting rotating field to said material;

c. forming and disposing on said layer of material a nucleating permalloy element having an angular portion and a contiguous remaining portion to effect nucleation at said angular portion when said angular portion is in the presence of said selective bias and rotating field values whereby magnetic bubbles are nucleated.

5. The invention of claim 4 wherein said rotating field is pulsed to obtain said selected rotating field value when said rotating field passes through said angular portion.

* * * * *